(12) United States Patent
Ho

(10) Patent No.: US 7,234,955 B1
(45) Date of Patent: Jun. 26, 2007

(54) ELECTRIC CONNECTOR FOR RELEASABLY ATTACHING A CHIP MODULE

(75) Inventor: Chien-Chih Ho, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/349,228

(22) Filed: Feb. 8, 2006

(51) Int. Cl.
*H01R 13/62* (2006.01)
(52) U.S. Cl. ..................................... 439/331
(58) Field of Classification Search ............... 439/331, 439/73, 564, 573
See application file for complete search history.

(56) References Cited

U.S. PATENT DOCUMENTS 6,991,474 B1 * 1/2006 Ju ............................. 439/73

2004/0266249 A1 * 12/2004 Hashimoto et al. ......... 439/331
2006/0105609 A1 * 5/2006 Huang et al. ............... 439/331

* cited by examiner

*Primary Examiner*—Tho D. Ta
*Assistant Examiner*—Vanessa Girardi
(74) *Attorney, Agent, or Firm*—Troxell Law Office, PLLC

(57) ABSTRACT

An electric connector for attaching a chip module onto a circuit board comprises a main body and a pressing structure pivotally mounted on two lateral sides of the main body for confining a chip module within the main body. The main body further comprises an insulating body and a plurality of conducting terminals, wherein the insulating body includes a plurality of receptacles for the conducting terminals and a plurality of retaining projections slightly higher than the conducting tips of the conducting terminals extended from the receptacles. There are at least two depressed sections, each provided with a sloppy surface, respectively along two opposite sides of the body for facilitating the removal of a chip module from the electric connector.

8 Claims, 5 Drawing Sheets

ELECTRIC CONNECTOR FOR RELEASABLY ATTACHING A CHIP MODULE

CROSS-REFERENCE TO RELATED APPLICATION

This application is related to currently pending U.S. patent application Ser. No. 11/352,203, filed Feb. 13, 2006.

BACKGROUND OF THE INVENTION (a) Field of the Invention

The present invention relates to electric connectors, more particularly to an electric connector connecting a chip module to a circuit board.

(b) Description of the Prior Art

Following the fast development of electronic technologies, the LGA type chip module is more and more commonly used. An electric connector of the prior art for connecting the chip module to a circuit board comprises a main body, a mount for housing the main body, a pair of clipping plates pivotally mounted on two sides of the man body and a rotary stick. The moan body further includes a terminal receptacle that houses a terminal for electric conduction and a retaining piece higher than the terminal receptacle. There is a through hole between the clipping plates when they are closed. The middle parts on two opposite inner rims of the through hole are each provided with an inwardly extended support piece, whereby a central processing unit of the chip module disposed within the electric connector can be driven to electrically connect the electrodes on a circuit board. The rotary stick can be locked on a retaining portion of the mount, so that the electric connection can be secured. However, the conventional electric connector has the disadvantage that the chip module is hard to take out, which influences the efficiency of a worker.

Therefore, it is necessary to invent a new electric connector that overcomes the above disadvantage.

SUMMARY OF THE INVENTION

Accordingly, the primary objective of the present invention is to provide an electric connector from which the chip module, such as a central processing unit, can be taken out easily.

To achieve the above objective, an electric connector of the present invention for attaching a chip module onto a circuit board comprises an insulating main body and a plurality of conducting terminals whose one end housed in a terminal receptacle of the insulating main body. The outer rim of the terminal receptacle is further provided with retaining piece higher than the terminal receptacle. The ends of the conducting terminals have a tip portion extended out of the terminal receptacle and folded to form conducting terminals for contacting the chip module electrically. The insulating main body further comprises a depressed portion for taking out the chip module.

Compared with the current technology, the two opposite lateral sides of the electric connector of the present invention are each provided with a sloped surface, thereby facilitating retrieving the chip module.

The various objects and advantages of the present invention will be more readily understood from the following detailed description when read in conjunction with the appended drawings.

DETAILED DESCRIPTION OF THE PREFERRED EMBODIMENTS

Figure 1:
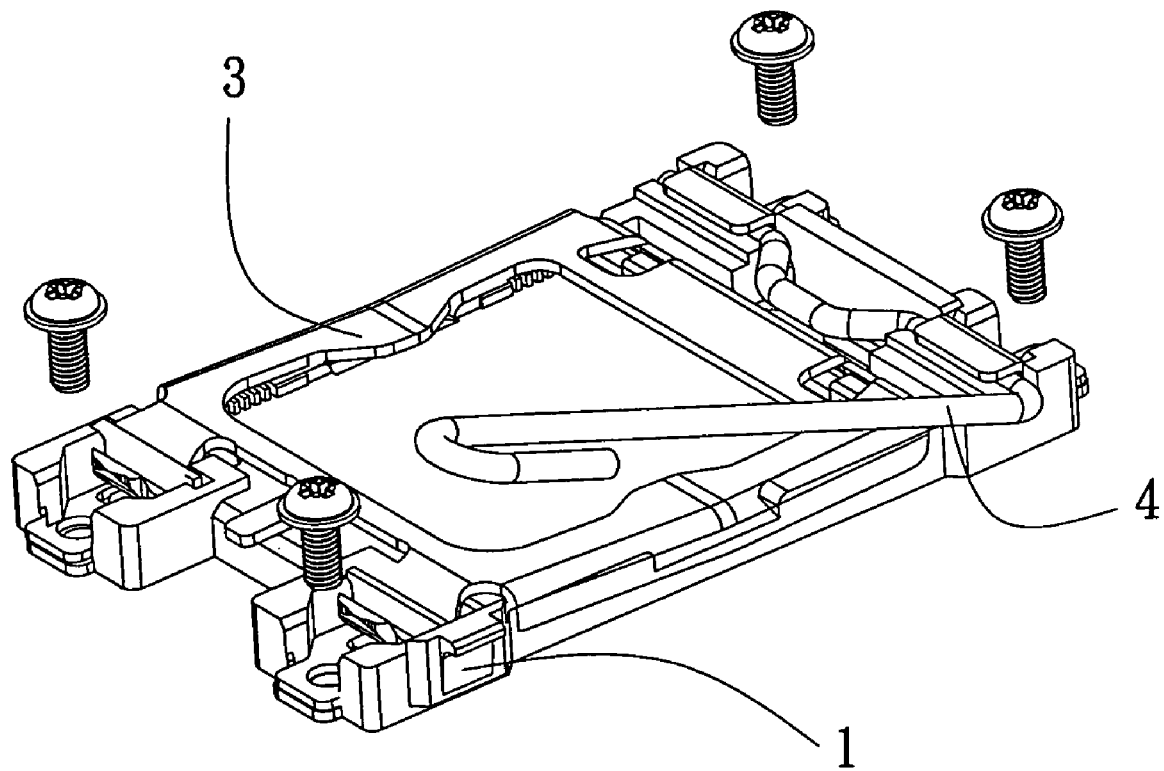
FIG. 1 is a perspective view of an electric connector of the present invention.
Figure 2:
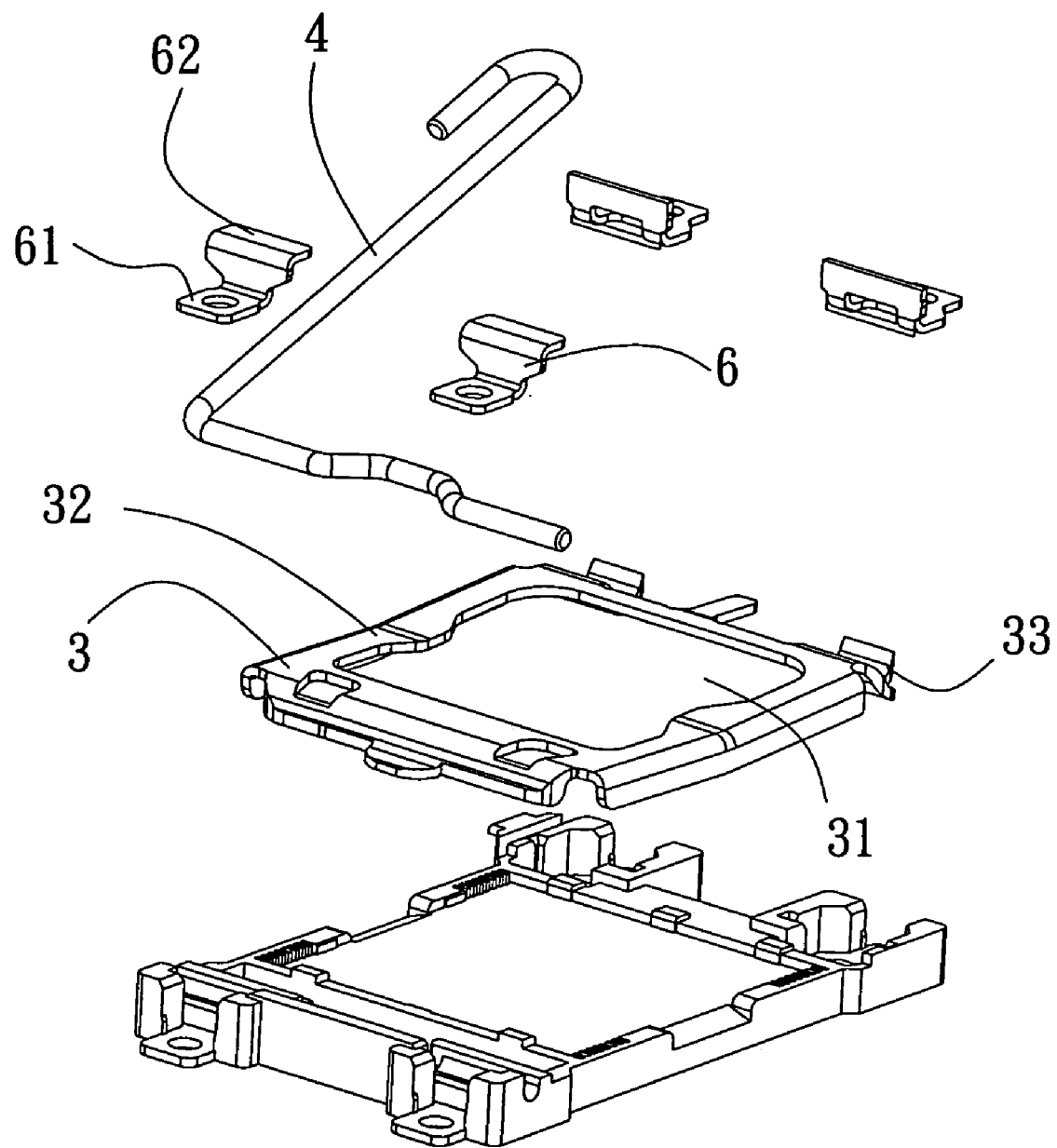
FIG. 2 is an exploded perspective view of the electric connector in FIG. 1.
Figure 3:
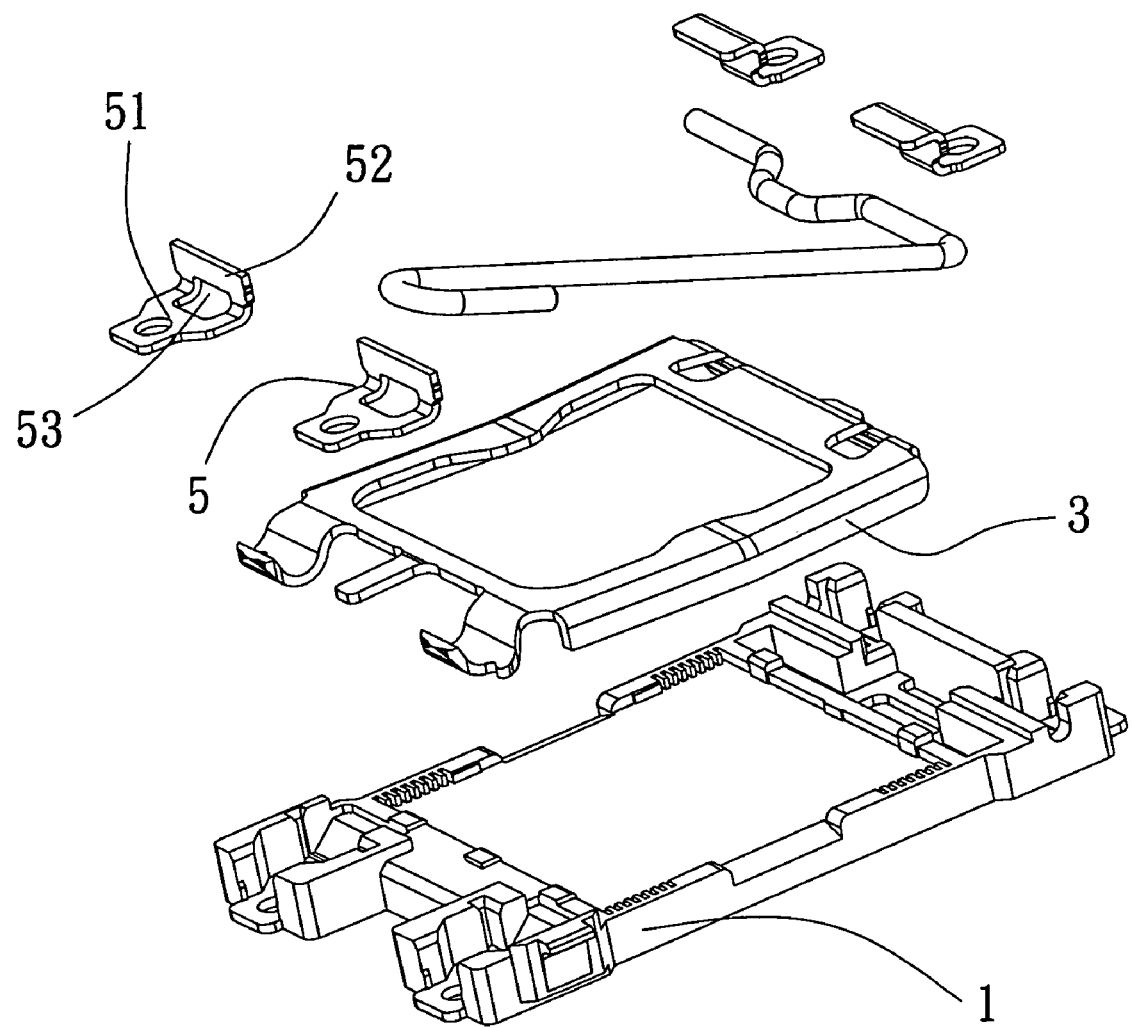
FIG. 3 is another exploded perspective view of the electric connector in FIG. 1 wherein the conducting terminals are absent.
Figure 4:
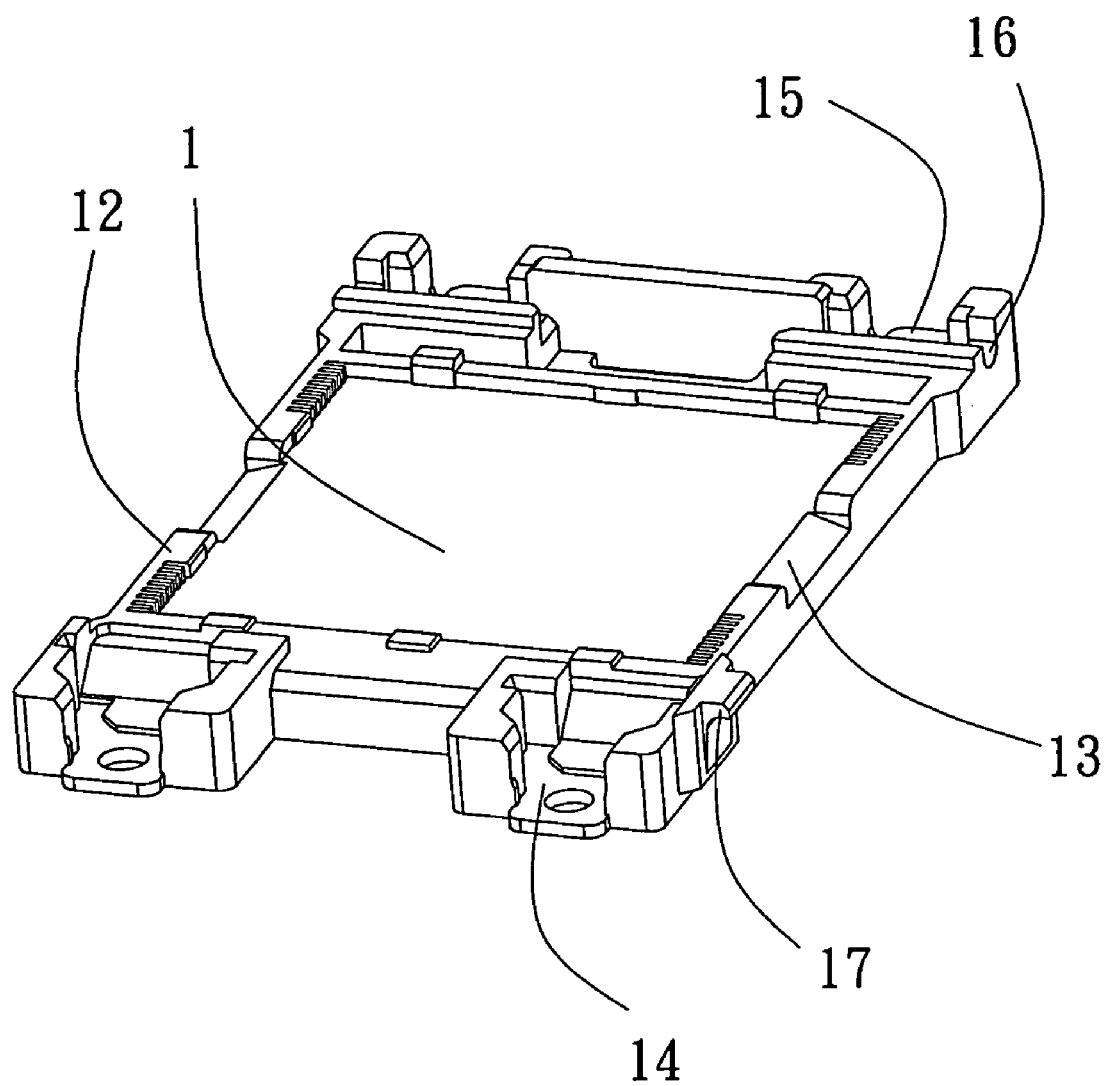
FIG. 4 is a perspective view of the insulating main body of the electric connector in FIG. 1.
Figure 5:
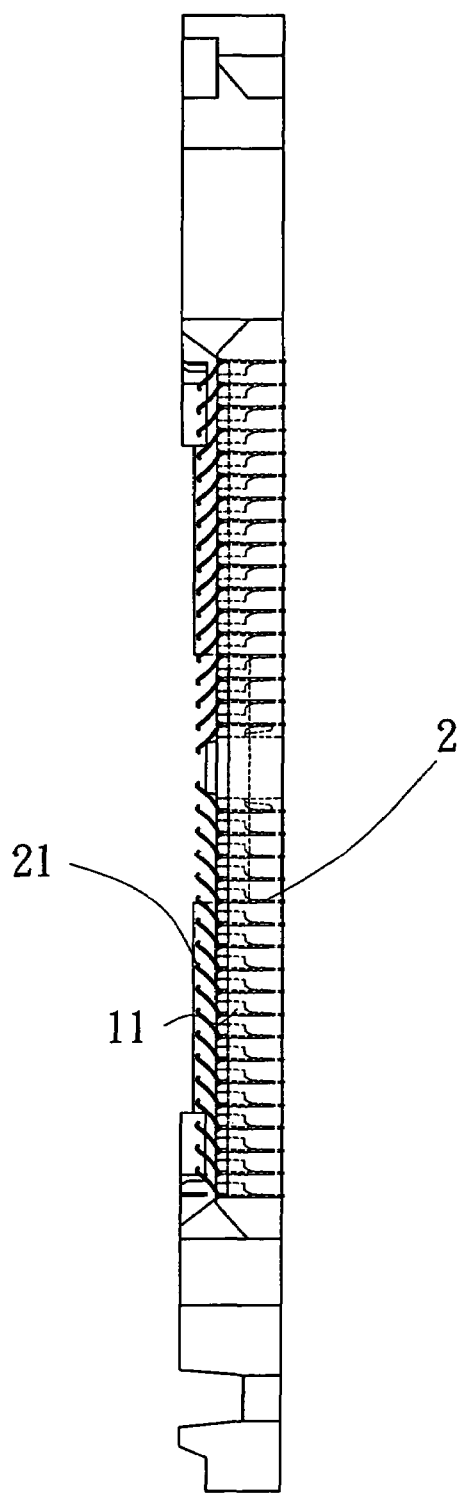
FIG. 5 is a side view of the insulating main body of the electric connector in FIG. 1 wherein the conducting terminals are shown.

Referring to FIGS. 1 to 5, an electric connector according to the present invention for attaching a chip module onto a circuit board comprises an insulting main body 1, a plurality of conducting terminals 2, a clipping board 3 and a driving stick 4. The clipping board 3 is pivotally connected to the insulting main body 1 by a pair of first retaining pieces 5, and the driving stick 4 is pivotally connected to the insulting main body 1 by a pair of second retaining pieces 6.

The insulting main body 1 further includes a set of terminal receptacles 11, a plurality of retaining projections 12 and at least one depressed portion 13 the facilitates the removal of a chip module form the electric connector. The depressed portion 13 is located on a lateral side of the insulting main body 1. In this preferred embodiment, there are two depressed portions 13 respectively located at the middle sections on two opposite sides of the insulting main body 1, whereby the depressed portions 13 will be located under the rim of the chip module. Further, the inner surface of either one of the depressed portions 13 is sloped (it can also be a flat plane). There are a pair of first receptacle grooves 14 for retaining the first retaining pieces 5 and a pair of second receptacle grooves 15 for retaining second retaining pieces 6. There are further a pair of stick locks 17 adjacent to the second receptacle grooves 15 for pivotally retaining the driving stick 4.

The conducting terminals 2 are housed within the terminal receptacles 11, with their free ends extended out of the terminal receptacles 11 and folded to form contact ends 21 so as to electrically connected to a chip module. However, the highest point of the contact ends 21 is still lower than the upper surfaces of the retaining projections 12.

The central portion of the clipping board 3 is provided with a central opening 31 with a pair of press portions 32 extended from the inner rim of the clipping board 3 inwardly, whereby the press portions 32 will press against a chip module when it is confined by the clipping board 3. The clipping board 3 further includes a pair of pivotally connected pieces 33 each with an inwardly curved surface.

Each of the first retaining pieces 5 comprises a first retaining section 51 and a vertical section 52 extended from the first retaining section 51 and folded upright with a receptacle hole 53 for receiving a corresponding one of the pivotally connected pieces 33 of the clipping board 3, whereby the clipping board 3 will be pivotally connected to the insulting main body 1. Each of the second retaining pieces 6 comprises a second retaining section 61 and a pressing section 62 extended from the second retaining section 61 and folded upright and then opposite to the second retaining section 61. The driving stick 4 is disposed beneath the pressing sections 62.

To remove a chip module within the electric connector, first open the clipping board 3 and then hold the edge of the chip module at the sloped surfaces of the depressed portions 13. The removal is therefore easy and will protect the conducting terminals.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An electric connector for attaching a chip module onto a circuit board, comprising:
    a main body further comprising an insulating body and a plurality of conducting terminals, said insulating body including a plurality of receptacles for said conducting terminals and a plurality of retaining projections slightly higher than conducting tips of said conducting terminals extended from said receptacles, at least two depressed sections being further provided respectively along two opposite sides of said insulating body; and
    a pressing structure for confining a chip module within said main body, wherein a clipping board is pivotally connected to said insulating main body through at least two, separately formed, first retaining pieces; each of said at least two first retaining pieces comprising a horizontal first retaining section having a securing hole into which a fastener is received thereby attaching each of said first retaining pieces onto said main body which is then attached onto the circuit board, each of the first retaining pieces further comprising a vertical section extended from said first retaining section and folded upright with a receptacle hole for receiving a corresponding one of said pivotally connected pieces of said clipping board.

2. The electric connector of claim 1 wherein a main inner surface of each of said depressed portions is a sloped surface tilted outward.

3. The electric connector of claim 1 wherein the highest point of each of said depressed portions is located between an upper surface and a lower surface of said chip module.

4. The electric connector of claim 1 wherein said depressed portions are located under a lateral boundary of said chip module.

5. The electric connector of claim 1 wherein said depressed portions respectively located at middle sections on two opposite sides of said insulting main body.

6. The electric connector of claim 1 wherein free ends of said conducting terminals are lower than the highest point of said retaining projections.

7. The electric connector of claim 1 wherein said pressing structure comprises a clipping board pivotally connected to two opposite sides of said main body and a driving stick.

8. The electric connector of claim 7 wherein said driving stick is pivotally connected to said insulating main body by passing through said second retaining pieces; each of said second retaining pieces further including a second retaining section and a pressing section extended from said second retaining section and folded upright and then opposite to said second retaining section; said driving stick being disposed beneath said pressing sections.

* * * * *